United States Patent [19]
McKee et al.

[11] Patent Number: 5,482,003
[45] Date of Patent: *Jan. 9, 1996

[54] PROCESS FOR DEPOSITING EPITAXIAL ALKALINE EARTH OXIDE ONTO A SUBSTRATE AND STRUCTURES PREPARED WITH THE PROCESS

[75] Inventors: Rodney A. McKee, Kingston; Frederick J. Walker, Oak Ridge, both of Tenn.

[73] Assignee: Martin Marietta Energy Systems, Inc., Oak Ridge, Tenn.

[ * ] Notice: The portion of the term of this patent shall not extend beyond the expiration date of Pat. No. 5,225,031.

[21] Appl. No.: 88,554

[22] Filed: Jul. 6, 1993

Related U.S. Application Data

[63] Continuation-in-part of Ser. No. 683,401, Apr. 10, 1991, Pat. No. 5,225,031.

[51] Int. Cl.[6] .................................................. C30B 25/14
[52] U.S. Cl. .......................... 117/108; 117/109; 117/944; 427/255; 427/255.3; 148/33
[58] Field of Search ................................. 117/108, 109, 117/944; 427/255, 255.3; 148/33

[56] References Cited

U.S. PATENT DOCUMENTS

| | | | |
|---|---|---|---|
| 3,645,788 | 2/1972 | Mee et al. | 156/614 |
| 3,850,679 | 11/1974 | Sopku et al. | 427/255.3 |
| 4,509,990 | 4/1985 | Vasudeu | 437/24 |
| 4,592,927 | 6/1986 | Stall | 427/255.3 |
| 4,927,670 | 5/1990 | Erbill | 427/253.3 |
| 5,225,031 | 7/1993 | McKee | 156/612 |

OTHER PUBLICATIONS

McKee et al., "Molecular Beam Epitaxy Growth of Epitaxial Barium Silicide, Barium Oxide . . . On Silicon", Appl. Phys. Lett. 59(7) Aug. 12, 1991 pp. 782–784.

*Primary Examiner*—Robert Kunemund
*Attorney, Agent, or Firm*—Michael E. McKee; George L. Craig; James M. Spicer

[57] ABSTRACT

A process and structure involving a silicon substrate utilize molecular beam epitaxy (MBE) and/or electron beam evaporation methods and an ultra-high vacuum facility to grow a layup of epitaxial alkaline earth oxide films upon the substrate surface. By selecting metal constituents for the oxides and in the appropriate proportions so that the lattice parameter of each oxide grown closely approximates that of the substrate or base layer upon which oxide is grown, lattice strain at the film/film or film/substrate interface of adjacent films is appreciably reduced or relieved. Moreover, by selecting constituents for the oxides so that the lattice parameters of the materials of adjacent oxide films either increase or decrease in size from one parameter to another parameter, a graded layup of films can be grown (with reduced strain levels therebetween) so that the outer film has a lattice parameter which closely approximates that of, and thus accomodates the epitaxial growth of, a pervoskite chosen to be grown upon the outer film.

21 Claims, 6 Drawing Sheets

PROCESS FOR DEPOSITING EPITAXIAL ALKALINE EARTH OXIDE ONTO A SUBSTRATE AND STRUCTURES PREPARED WITH THE PROCESS

This invention was made with Government support under Contract No. DE-AC05-84OR21400 awarded to Martin Marietta Energy Systems, Inc. and the Government has certain rights in this invention. This application is a continuation-in-part of application Ser. No. 07/683,401 filed Apr. 10, 1991 now U.S. Pat. No. 5,225,031 and entitled PROCESS FOR DEPOSITING AN OXIDE EPITAXIALLY ONTO A SILICON SUBSTRATE AND STRUCTURES PREPARED WITH THE PROCESS, the disclosure of which is incorporated herein by reference.

BACKGROUND OF THE INVENTION

This invention relates generally to the preparation of structures for use in semiconductor applications and relates, more particularly, to the formation of thin films upon a substrate.

The film-growth materials with which this invention is concerned includes alkaline earth oxides, such as BaO, SrO, CaO and MgO, which each have a sodium chloride-type lattice structure. Silicon similarly has a face-centered-cubic lattice structure, and the match between lattice parameters of silicon and the aforelisted oxides promote the epitaxial growth of film layers of the oxides upon the surface of silicon.

While the match between lattice parameters of silicon and any of the aforementioned alkaline earth oxides is relatively close, any mismatch between lattice parameters of adjacent layers can spawn lattice strain at the interface of the adjacent layers, and such strain may lead to the development of dislocations or other undesirable defects at the interface. It would therefore be desirable to provide a process for growing epitaxial layers with materials having sodium chloride-type lattice structures and wherein lattice strain at the interface of adjacent layers is appreciably reduced or, in the alternative, virtually eliminated.

Accordingly, it is an object of the present invention to provide a new and improved process of depositing an epitaxial layer of alkaline earth oxide upon another layer having an ordered face-centered-cubic lattice structure like that of silicon or an alkaline earth oxide having a sodium chloride-type lattice structure wherein lattice strain between adjacent layers is reduced or eliminated and a structure formed with the process.

Another object of the present invention is to provide such a process wherein the interfacial coherence and crystalline quality at the interface between adjacent layers of the resulting structure is improved.

Yet another object of the present invention is to provide such a process which can be used for epitaxially growing an alkaline earth oxide upon a base layer of silicon or upon a base layer of another alkaline earth oxide.

Still another object of the present invention is to provide such a process which is well-suited for growing an epitaxial film of MgO upon a silicon substrate.

SUMMARY OF THE INVENTION

This invention resides in a process for depositing an epitaxial oxide having a sodium chloride-type lattice structure onto a material surface provided by an ordered face-centered-cubic (fcc) lattice structure like that of silicon or an alkaline earth oxide having a sodium chloride-type lattice structure, and also resides in a structure formed with the process.

One aspect of the process includes the steps of providing a base having a surface which is defined by material provided with an fcc lattice structure like that of silicon of an alkaline earth oxide having a sodium chloride-type lattice structure, and positioning the base within an ultra-high vacuum facility. At least one metal is selected which, when combined with oxygen to form an alkaline earth oxide, has a lattice parameter which closely approximates that of the lattice structure which provides the material surface. A film of the alkaline earth oxide is then grown with the selected metal and within the facility so that the lattice parameter of the layers of grown oxide closely approximates that of the lattice structure of the material surface.

In the event that the base is silicon, the step of growing includes a heating of the silicon material to a high temperature, and a developing of an ultra-high vacuum, oxygen-free environment upon the surface of the silicon material. An amount of the selected metal is then deposited from a flux source onto the silicon surface until a fraction of a monolayer of the selected metal covers the silicon surface while the environment of the material surface is maintained oxygen-free and at a relatively high temperature so that the selected metal and the silicon of the material surface react to form a submonolayer of a compound which is epitaxially matched to that of the silicon surface at the metal/silicon interface. The temperature of the silicon is then lowered to between 200° and 300° C., and an additional amount of the selected metal is deposited from the flux source upon the silicon surface until the surface is covered by about one monolayer of the selected metal. Without exposing the metal-covered surface, the pressure of the high vacuum environment is subsequently raised to a target pressure of between about $1\times10^{-6}$ torr and $5\times10^{-6}$ torr with the introduction of oxygen, and an additional amount of the selected metal is introduced from the flux source into the high vacuum environment necessary to deposit the selected metal upon the silicon surface at a relatively slow rate. Upon reaching the target pressure, the metal-covered surface is exposed to the oxygen and metals within the high vacuum environment so that the epitaxial alkaline earth oxide having a lattice parameter which closely approximates that of the lattice structure begins to grow upon the silicon surface.

Another aspect of the process involves the selection of at least one metal which when combined with oxygen to form an alkaline earth oxide, has a lattice parameter which creates no more than about a 2% lattice strain at the oxide/material interface when deposited epitaxially upon the material surface. In addition, the oxide is grown one monolayer at a time until at least four monolayers of the oxide are grown upon the material surface. The limiting of the lattice strain to no more than about 2% and the formation of at least four monolayers of the oxide permit the lattice strain created at the oxide/material interface to be relieved through the layers of oxide so that the likelihood of the creation of any catostrophic strain within the oxide film is very small.

DETAILED DESCRIPTION OF ILLUSTRATIVE EMBODIMENTS

Figure 1:
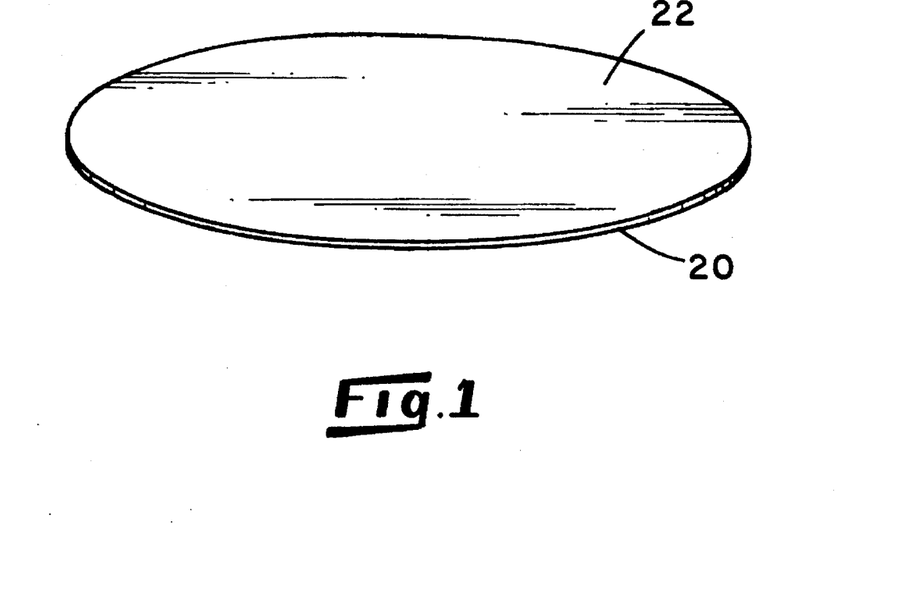
FIG. 1 is a perspective view of a silicon wafer upon which epitaxial oxides films can be grown in accordance with the method of the present invention.

With reference to FIG. 1 there is illustrated a silicon wafer or substrate 20 having a surface 22 over which epitaxial films can be grown in accordance with the process of the present invention. As is described herein and with reference to FIG. 2, steps are taken to cover the surface 22 with an epitaxial film 24 of $Ba_{0.725}Sr_{0.275}O$, then to cover the film 24 with an epitaxial film 26 of SrO, then to cover the film 26 with an epitaxial film 28 of $Sr_{0.333}Ca_{0.667}O$, then to cover the film 28 with an epitaxial film 30 of CaO, and then to cover the film 30 with an epitaxial film 32 of MgO. The resultant structure, indicated 36 in FIG. 2, therefore includes a layup of alkaline earth oxide films of different composition wherein each film includes a plurality of individual oxide layers of identical composition.

Figure 2:
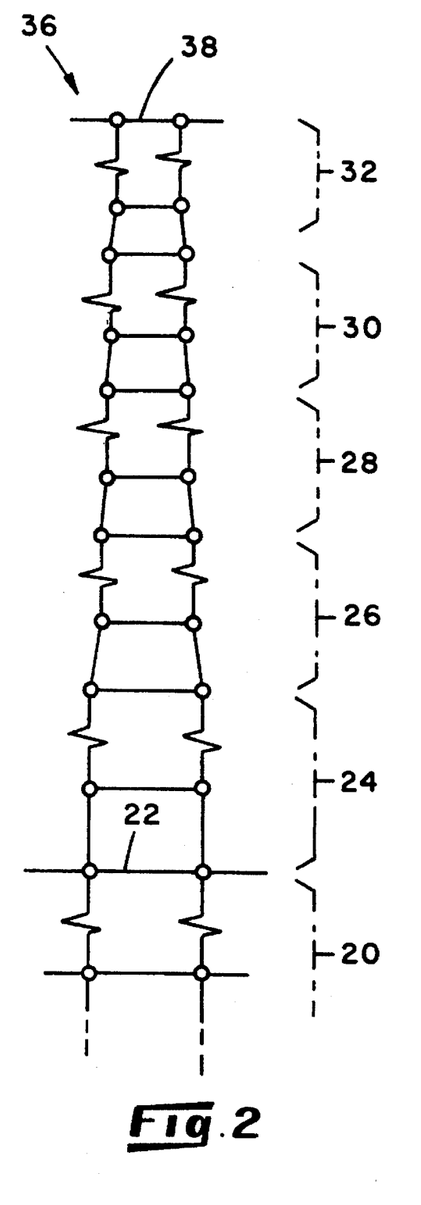
FIG. 2 is a fragmentary cross-sectional view of a structure grown in accordance with an embodiment of the present invention illustrating schematically the superposed lattices of adjacent films of the structure.

Once the epitaxial layer 24 of $Ba_{0.725}Sr_{0.275}O$ is in place upon the silicon surface 22, the formation of amorphous silica, e.g., SiO or $SiO_3$, or other glassy silicates at the silicon surface 22 upon exposure of the surface 22 to oxygen is blocked, and each oxide layer 24, 26, 28 or 30 serves as a template upon which each subsequent oxide layer 26, 28, 30, 32 or 34 is epitaxially formed. The outermost film 32 of MgO, in turn, may provide a template upon which a layer of a pervoskite, such as $BaTiO_3$, can be grown. Since MgO has a slower reaction to water vapor than does any of the oxides comprising the earlier-formed layers 24, 26, 28 or 30, its use as an underlayer upon which pervoskite can be grown is advantageous in this respect. In the broader aspects of the present invention, however, any of the earlier-formed layers 26, 28, 30 or 32 could be used as a template for subsequent pervoskite growth.

As will be apparent herein, the process of the present invention takes advantage of the lattice matching that exists at the interface of adjacent films of the structure 36. To this end, the lattice structures at the interface of adjacent films have parameters which are so close together that the likelihood of any appreciable lattice strain at the film/film interface is significantly reduced. In the depicted structure 36 and as will be apparent herein, the lattice parameters of the materials of adjacent layers are within about 0.002 nm from one another.

At the outset of a process performed with the present invention, the surface 22 of the silicon substrate 20 is cleaned to atomic cleanliness so that only silicon atoms are present at the surface 22. To this end, the surface 22 is cleaned by a process commonly referred to as a Modified RCA technique. The Modified RCA technique is a well-known process involving the chemical production of an oxide at a silicon surface being cleaned and subsequently placing the surface in a high vacuum environment and raising the temperature of the surface to sublime the oxide off of the surface.

The layers of the structure 36 are formed by molecular beam epitaxy (MBE), electron beam evaporation techniques and with MBE equipment. The MBE equipment includes an ultra high vacuum (UHV) growth/characterization facility, a fragment of which is indicated 40 in FIG. 3. The facility 40 includes a container 42 having an inner chamber within which the substrate 20 is positioned so that its surface 22 faces downwardly, and a plurality of canisters 44, 46 and 48 are provided within the base of the container 42 for providing a vapor source of metals desired to be added to the substrate surface 22 during the formation of the structure 36. In this connection, each canister 44, 46 and 48 is adapted to hold a crucible containing a desired metal and contains heating elements for vaporizing the metal. An opening is provided in the top of each canister, and a shutter is associated with the canister opening for movement between a closed condition at which the interior of the container is closed and thereby isolated from the substrate surface 22 and an opened condition at which the contents of the container, i.e., the metal vapor, is exposed to the substrate surface 22. In the depicted facility, an amount of the metal barium (Ba) is positioned within the canister 44, an amount of strontium (Sr) is positioned within the canister 46, and an amount of calcium (Ca) is positioned within the canister 48. In addition, an oxygen source 52 is connected to the chamber so that by opening and closing a valve associated with the source 52, oxygen can be delivered to or shut off from the chamber. The opening and closing of each canister shutter and the oxygen source valve is accurately controlled by a computer controller (not shown).

Figure 3:
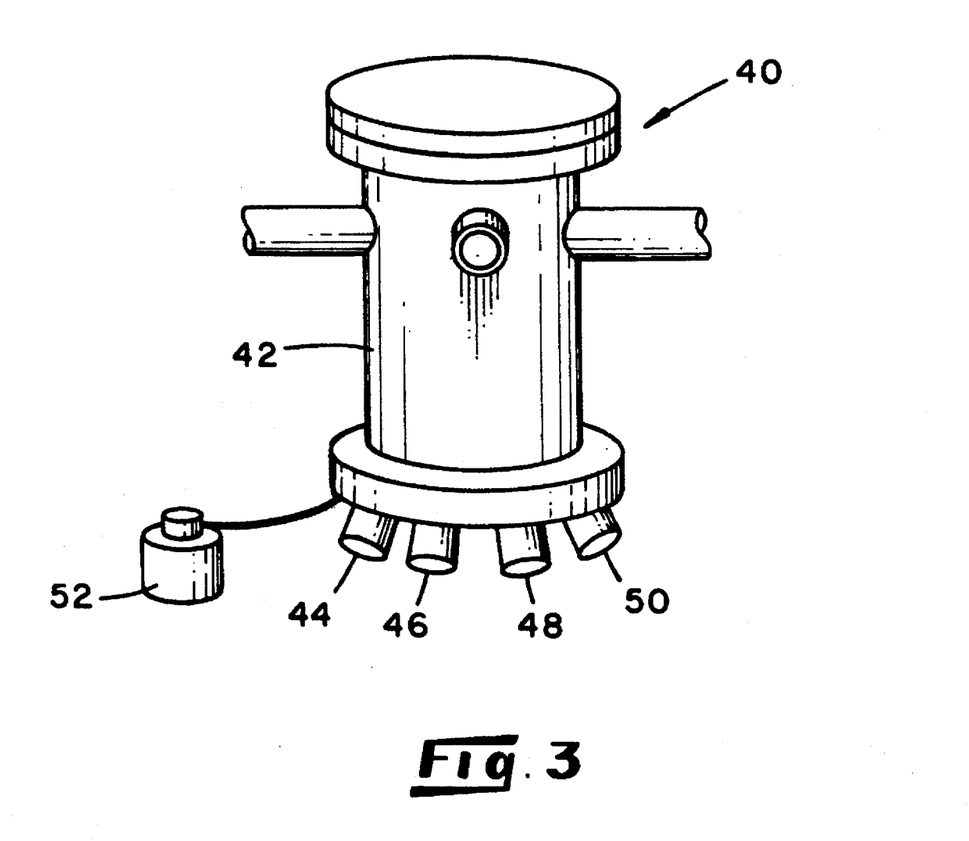
FIG. 3 is a schematic perspective view of a fragment of the ultra high vacuum equipment with which steps of the process of the present invention can be performed.

For the purpose of creating a vapor source of MgO within the facility 30, there is provided electron beam evaporation (EBE) apparatus 50 within the base of the container 42. The apparatus 50 includes conventional EBE components including a hearth containing a quantity of MgO and means for directing an accelerated electron beam toward the MgO amount. During a stage of the process described herein at which the film 32 (FIG. 2) of MgO is grown upon the film 30 of CaO, MgO molecules are released at a controlled rate from the MgO amount by EBE techniques and settle upon the CaO surface.

One other feature of the facility 40 is that a closable substrate shutter is disposed immediately below the downwardly-directed face of the substrate surface 22 for isolating, when desired, the substrate surface 22 from exposure to the metal vapors from the canisters or the oxygen from the oxygen source 52 while the internal pressure of the facility chamber is raised with the oxygen from the source 52. The substrate shutter is closed during one step of the present process as will be apparent herein.

The vacuum drawn in the UHV facility 40 to complete the Modified RCA cleaning technique upon the substrate 20 is between about $10^{-9}$ and $10^{-10}$ torr, and the substrate 20 is heated to raise the substrate temperature to a temperature sufficient to drive the oxides off of the surface 22. In practice, such a temperature may be between about 850° and 1050° C., and the desired surface cleanliness may be confirmed in-situ during the substrate heating operation by Reflection High Energy Electron Diffraction (RHEED) techniques. For present purposes, the silicon substrate 20 reaches atomic cleanliness upon the development of 2×1 Si(100) at the surface 22 as evidenced by RHEED analysis.

Upon reaching of the desired atomic cleanliness, a mixture of a predetermined amount of Barium (Ba) metal and a predetermined amount of Strontium (Sr) metal is deposited upon the substrate surface 22 so that a fraction, e.g., about one-fourth, of a monolayer of the mixture covers the substrate surface 22. In other words, the Ba and Sr metal mixture is deposited upon the substrate surface 22 until about one atom of the mixture overlies the silicon surface 22 for every four atomic sites of Si. To this end, Ba vapor and Sr vapor is created in the corresponding canisters and the corresponding canister shutters are opened to expose the clean substrate surface 22 to the Ba and Sr mixture.

The ratio of Ba to Sr in the Ba/Sr vapor mixture is selected with regard to the lattice parameter of the silicon structure defining the substrate surface 22. In particular, the lattice parameter of the silicon structure is known to be 0.543 nm, and the lattice parameter of the structure of a $Ba_xSr_{1-x}O$ compound (formed upon the substrate surface 22 in a manner described herein) is selected to closely match that of the silicon structure so that that when epitaxially covering the silicon surface 22, no appreciable strain exists at the $Si/Ba_xSr_{1-x}O$ interface. In this connection, it is also known that the lattice parameter of $Ba_xSr_{1-x}O$ varies substantially linearly as the ratio of Sr to Ba is increased in this compound from 0.0% to 100%. Thus, when the variable "x" in this compound equals 1.0, the lattice parameter of the compound is 0.554 nm (corresponding with the lattice parameter of pure BaO), and when the variable "x" in the compound equals 0.0, the lattice parameter of the compound equals 0.514 nm (corresponding with the lattice parameter of pure SrO).

In the depicted example, the ratio of Ba to Sr in the $Ba_xSr_{1-x}O$ compound is selected to provide a lattice parameter of the $Ba_xSr_{1-x}O$ compound which exactly matches the lattice parameter of silicon or, in other words, is selected to provide the $Ba_xSr_{1-x}O$ compound with a lattice parameter of 0.543 nm. To this end, the variable "x" in this compound equals 0.725 so that the proportion of BaO to SrO in the oxide compound eventually formed upon the substrate surface 22 is 0.725 to 0.275.

Accordingly, in the process step described herein in which the Ba and Sr metals are deposited upon the silicon substrate so as to form a submonolayer thereon involves the exposure of the substrate surface 22 to a mixture of Ba and Sr vapors wherein the ratio of Ba to Sr in the mixture is 0.725 to 0.275. Such exposure can be effected with the facility 40 by either of two methods. One method involves the production of a flux vapor of Ba and a flux vapor of Sr from the canisters 44 and 46 containing Ba and Sr, respectively, so that the combined vapor fluxes emitted from the canisters provides the desired, i.e. target, ratio of Ba to Sr in the Ba/Sr vapor mixture. The other method involves the control of the amount of time that the shutters of the Ba and Sr-containing canisters are opened so that the appropriate amounts of Ba and Sr vapors are emitted from the corresponding canisters and become mixed in the facility 40. In any event, the techniques used to produce a mixture of metal vapors in the facility 40 wherein the vapor mixture contains a desired ratio of one metal vapor to another metal vapor are techniques which are known and common to MBE so that the desired Ba to Sr ratio in a mixture of Ba and Sr vapors can be achieved in the facility with a high degree of accuracy.

Upon completion of the deposition of the desired fraction of the monolayer of Ba and Sr atoms upon the substrate surface 22, the substrate 20 is cooled to about 200°–300° C. while the high vacuum environment is maintained about the substrate 20, and the remainder of one monolayer of Ba and Sr is then deposited upon the substrate surface. To this end, the shutters of the canisters of Ba and Sr can be opened for an appropriate period of time sufficient for the desired mixture of Ba and Sr vapor (wherein the ratio of Ba to Sr in the vapor mixture is 0.725 to 0.275) is exposed to the substrate. By cooling the substrate 20 to the lower temperature, i.e., 200°–300° C., the attachment of Ba and Sr atoms to the substrate surface is promoted because the added Ba and Sr atoms remain in a metallic state and do not form silicide at or below these lower temperatures.

A purpose for developing the monolayer of Ba and Sr atoms at the Ba/Sr interface is to form a template surface provided by a stable layer of silicide upon which subsequent oxide layers can be grown. It is desirable, therefore, that the cubic polymorph structure of $BaSi_2$ or $SrSi_2$, rather than the structure of BaSi or SrSi, be grown (as a reaction) between the barium and silicon or between the strontium and silicon as simple surface reactions, the temperature of the substrate 20 at which the one-fourth monolayer of Ba and Sr is deposited upon the Si surface is maintained above 840° C. To deposit the Ba and Sr upon the Si surface at a lower temperature may result in a lattice structure which is not suited for subsequent growth of an oxide. Although phase diagrams may be referred to for formation of $BaSi_2$ or $SrSi_2$ at a temperature lower than 840° C. by controlling other parameters, e.g., chamber pressure, at the Si surface to ensure that $BaSi_2$ and $SrSi_2$ is formed upon the Si surface with the UHV environment described herein, i.e., between $10^{-9}$ and $10^{-10}$ torr, the temperature of the silicon substrate 20 is lowered to no less than about 850° C. before exposure of the clean substrate surface 22 to the Ba and Sr metal.

With the stable monolayer of silicide formed at the interface between the Ba and Si and between the Sr and Si, $Ba_{0.725}Sr_{0.275}O$ can be grown epitaxially upon the silicon. To this end, the substrate shutter is closed to prevent exposure of the substrate surface 20 to the facility chamber contents, and the pressure of the chamber is raised to about 1 to $5\times10^{-6}$ torr of oxygen while maintaining Ba and Sr vapor source operations that would be needed to deposit Ba and Sr metal upon the substrate surface at a predetermined rate and in the desired, or target, proportions of Ba to Sr. Upon reaching the target oxygen pressure, e.g., $1\times10^{-6}$ torr, the substrate shutter is opened to expose the Ba and Sr-coated surface of the subtrate to oxygen and additional Ba and Sr atoms. Upon such exposure, $Ba_{0.725}Sr_{0.275}O$ begins to grow epitaxially upon the Ba and Sr-coated surface.

By appropriately opening and closing off the exposure of the substrate surface to the Ba and Sr metals and oxygen by cyclically exposing the substrate surface to the Ba and Sr metals and oxygen, $Ba_{0.725}Sr_{0.275}O$ is grown (at a relatively slow rate) upon the substrate surface one layer at a time. Such a growth pattern is continued until the monolayers of $Ba_{0.725}Sr_{0.275}O$ develop sufficient stability to prevent the formation of an amorphous silicate. It has been found that such stability can be achieved upon the formation of a $Ba_{0.725}Sr_{0.275}O$ thickness of about 1.0 nm (equivalent to about two cell units high). If desired, the substrate temperature may be raised after the formation of about five monolayers of $Ba_{0.725}Sr_{0.275}O$ to increase the mobility of the atoms at the site of the monolayer being formed and to thereby increase the growth rate of the monolayer.

Upon formation of the stable film (of multiple layers) of $Ba_{0.725}Sr_{0.275}O$ upon the substrate surface 22, steps are taken to deposit SrO upon the film. To this end, layers of SrO are built upon the $Ba_{0.725}Sr_{0.275}O$ surface by conventional MBE techniques while the internal pressure of the facility 40 is maintained between about $1\times10^{-6}$ torr and $5\times10^{-6}$ torr For example, Sr metal vapor could initially be deposited upon the $Ba_{0.725}Sr_{0.275}O$ film and then oxygen from the source 52 could be released over the film so that the desired film of SrO is grown layer-by-layer upon the $Ba_{0.725}Sr_{0.275}O$ film. Alternatively, the $Ba_{0.725}Sr_{0.275}O$ film surface could be simultaneously exposed to Sr vapor and oxygen, in controlled amounts, so that SrO forms and then accumulates layer-by-layer upon the $Ba_{0.725}Sr_{0.275}O$ film.

As a further alternative MBE process to build up the SrO film upon the $Ba_{0.725}Sr_{0.275}O$ film, a submonolayer of the Sr metal could initially be deposited upon the $Ba_{0.725}Sr_{0.275}O$ film under high-vacuum and high temperature conditions and then completing the build-up of a single monolayer of Sr at a lower temperature before oxygen is introduced to the Sr-covered surface. Thus, SrO could be built upon the $Ba_{0.725}Sr_{0.275}O$ film in much the same manner that the $Ba_{0.725}Sr_{0.275}O$ film is built upon the silicon substrate. However, when comparing the amount of time required in this process to build up the Sr metal in increments of a monolayer to the amount of time needed in the alternative MBE techniques described above to build up a film of SrO in a layer-by-layer fashion, a technique enabling a layer-by-layer build-up may be preferred as the faster method.

While using any of the aforementioned MBE film-growing techniques, the SrO is built up upon the $Ba_{0.725}Sr_{0.275}O$ film to form an epitaxial SrO film having a thickness which provides the SrO with satisfactory stability. It has been found that such stability may be achieved upon the formation of a SrO thickness of about 2.5 nm (equivalent to about four cell units high).

Upon formation of the stable film of SrO, steps comparable to those performed in growing the SrO film upon the $Ba_{0.725}Sr_{0.275}O$ film are performed for growing a film of $Sr_yCa_{1-y}O$ upon the SrO film. More specifically, layers of $Sr_yCa_{1-y}O$ are built upon the SrO surface by conventional MBE techniques while the internal pressure of the facility 40 is maintained between about $1 \times 10^{-6}$ torr and $5 \times 10^{-6}$ torr. For example, Sr and Ca metal vapor (in the appropriate amounts) could initially be deposited upon the SrO film and then oxygen from the source 52 could be released over the film so that the desired film of $Sr_yCa_{1-y}O$ is grown layer-by-layer upon the SrO film. Alternatively, the SrO film surface could be simultaneously exposed to Sr vapor, Ca vapor and oxygen, in controlled amounts, so that $Sr_yCa_{1-y}O$ forms and then accumulates layer-by-layer upon the SrO film.

In the example described, the ratio of Sr to Ca used in the build up of the $Sr_yCa_{1-y}O$ film is selected to provide a lattice parameter which closely approximates that of the lattice parameter of SrO (0.514 nm) and which is intermediate of, e.g., about midway between, the lattice parameter of SrO and the lattice parameter of CaO (0.462 nm), which is subsequently formed upon the $Sr_yCa_{1-y}O$ film. In this connection, it is known that the lattice parameter of $Sr_yCa_{1-y}O$ varies substantially linearly as the ratio of Ca to Sr is increased in this compound from 0.0% to 100%. Therefore, to provide a $Sr_yCa_{1-y}O$ compound with an intermediate lattice parameter of 0.49 nm, the variable "y" in the compound is chosen to be 0.333 so that the proportion of SrO to CaO in the oxide compound formed upon the SrO film surface is 0.333 to 0.667. Accordingly, the process steps involving the release of Sr and Ca vapor for subsequent deposition (or accumulation as an oxide) upon the SrO film surface utilizes a Sr/Ca ratio of 0.333 to 0.667, and the alkaline earth oxide film grown upon the SrO film is $Sr_{0.333}Ca_{0.667}O$.

Upon formation of a stable film of $Sr_{0.333}Ca_{0.667}O$ upon the SrO film (which could, for example, be obtained with a film coverage of about 10 monolayers, or a thickness of five cell units), steps are taken to deposit CaO upon the film. More specifically, layers of CaO are built upon the $Sr_{0.333}Ca_{0.667}O$ surface by conventional MBE techniques while the internal pressure of the facility 40 is maintained between about $1 \times 10^{-6}$ torr and $5 \times 10^{-6}$ torr. For example, Ca metal vapor could initially be deposited upon the $Sr_{0.333}Ca_{0.667}O$ film and then oxygen from the source 52 could be released over the film so that the desired film of CaO is grown layer-by-layer upon the $Sr_{0.333}Ca_{0.667}O$ film. Alternatively, the $Sr_{0.333}Ca_{0.667}O$ film surface could be simultaneously exposed to Ca vapor and oxygen, in controlled amounts, so that CaO forms and then accumulates layer-by-layer upon the $Sr_{0.333}Ca_{0.667}O$ film.

The CaO is built up upon the $Sr_{0.333}Ca_{0.667}O$ film in a layered fashion until the grown monolayers of CaO develop sufficient stability. It has been found that sufficient stability of the CaO film can be obtained with a CaO film thickness of about 10.0 nm, or about 20 monolayers of CaO.

Upon formation of the stable film (of multiple layers) of CaO upon the $Sr_{0.333}Ca_{0.667}O$ film, steps are taken to deposit MgO upon the film. To this end, electron beam evaporation (EBE) steps involving the beam-induced evaporation of MgO molecules are released, at a controlled rate, within the interior of the facility 40 (FIG. 3) from an amount of MgO contained within the facility apparatus 50 and accumulate in a layer-by-layer, epitaxial build up upon the surface of the CaO film. During the growth of the MgO film, the internal pressure of the facility 40 is maintained between about $1 \times 10^{-6}$ torr and $5 \times 10^{-6}$ torr.

It will be understood that a film of MgO could be (and has been) grown epitaxially upon the CaO film by MBE techniques, rather than by EBE techniques. It has been found, however, that the release of Mg (which has a very low partial pressure) during an MBE deposition technique leads to an internal contamination of the facility 40 with Mg atoms that is relatively difficult to clean. Therefore, for the sake of maintaining the facility relatively free of contaminants, the controlled handling of MgO molecules (during an EBE technique) is likely to be preferred over the controlled handling of Mg atoms (during an MBE technique). In either instance, however, the growth of the desired film of MgO is effected in an ultra-high vacuum facility capable of maintaining the relatively low pressures needed for the desired film growth.

The MgO film is grown layer-by-layer upon the CaO film until the accumulated monolayers of MgO develop sufficient stability, i.e., resumes a bulk crystalline form. It has been found that sufficient stability of the MgO film can be obtained at a MgO film thickness of about 10.0 nm, or about four unit cells. Upon completion of the desired MgO film, the structure 36 is completed and its outer layer of MgO may be subsequently used as a template upon which other materials, such as a pervoskite, can be epitaxially grown.

As mentioned earlier, the structure 36 is advantageous in that the layers with which each film of the structure interfaces with an adjacent film of the structure have lattice parameters which are so closely matched to one another that the likelihood of destructive lattice strain developing at the film interface is very small. Thus, the build up of films in the formation of the structure involves the successive formation of films having lattice parameters which are graded in size between that of the silicon substrate 20 to that of the outermost film 32 of MgO so that lattice strain developed, if at all, between adjacent films is very small. A substantially strain-free surface of CaO film (upon which the MgO film is grown) can be obtained, when measured from an underlying substrate of silicon, within a total film depth of about 25 unit cells, or within about 10.0 nm, and the aforedescribed process is further advantageous in this regard.

Another advantage provided by the structure 36 relates to its outer film of MgO. In particular and as mentioned earlier, MgO is less reactive to water vapor than are any of the aforementioned oxides involving Ba, Sr or Ca. If for example, BaO is used as intermediate layer between silicon and a pervoskite, and a defect, e.g., a pinhole, is created in the structure so that the BaO is exposed to a moisture-containing environment, the BaO is likely to react with water vapor to form an amorphous body of $Ba(OH)_2$ between the silicon and pervoskite. Therefore by constructing in a structure a pervoskite off of a layer of MgO, rather than BaO (or SrO or CaO), water vapor to which the underlayer of MgO could be exposed, by way of a defect in the structure, will not readily create an amorphous body beneath the pervoskite. Along the same lines, the MgO film helps to insolate the other underlying oxide films from water vapor.

Figure 4:
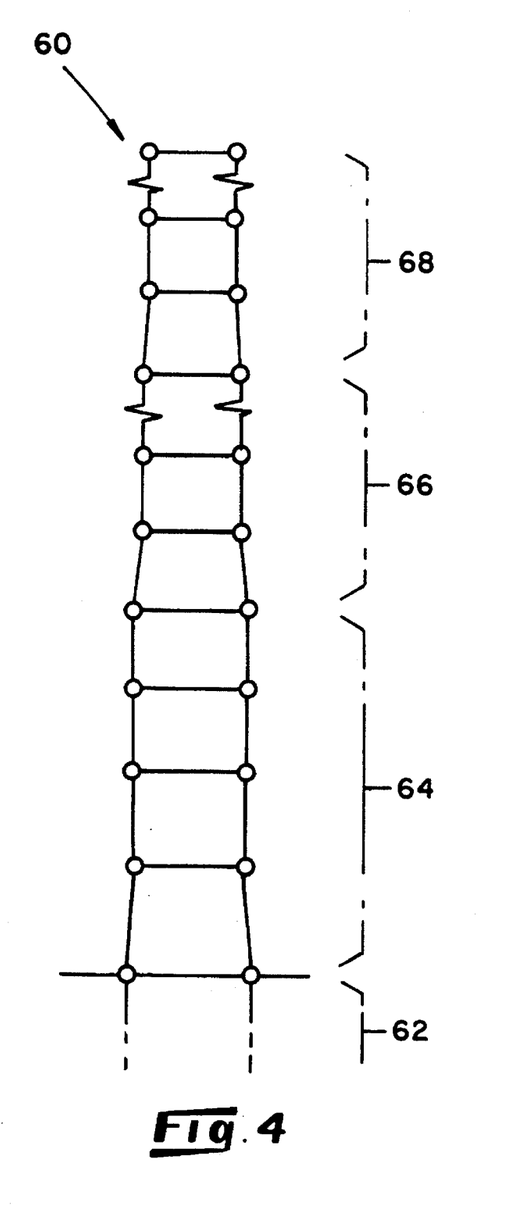
FIG. 4 is a view similar to that of FIG. 2 of an alternative structure grown in accordance with another embodiment of the present invention.

With reference to FIG. 4, there is shown a cross-sectional view of another structure, generally indicated 60, which has been formed in accordance with another embodiment of the process of the present invention. The structure 60 is comprised of a base substrate 62 of silicon and a layup of films 64, 66 and 68 of alkaline earth oxide which have been grown one layer at a time upon the silicon substrate 62.

The structure 60 is characterized in that the lattice parameters of the layers of adjacent films (or the layers of the film 64 and the substrate 62) provide less than 2% strain between film/film or film/substrate interface and wherein each film is comprised of at least four monolayers of material. In this connection, lattice strain, $\epsilon$, between adjacent layers is calculated, in percent, in accordance with the following equation:

$$\epsilon = [(p_1 - p_2)/p_1] \times 100\%$$

wherein $p_1$ is the lattice parameter of the silicon or oxide substrate providing the base layer upon which the superposed oxide layer is formed, and $p_2$ is the lattice parameter of the superposed oxide structure formed upon the base layer.

To construct the films of the structure 60, each film is built layer-by-layer upon its underlying surface (or underlayer) until the desired film height of four monolayers is achieved. During the film construction, MBE techniques similar to those previously described in constructing the film layers of the structure 35 of FIG. 3 are used. In order to construct the oxide film 64 upon the silicon substrate 62, a fraction of a monolayer of the metal(s) of the desired oxide is initially deposited upon the substrate 62 under high vacuum, high temperature conditions. The substrate temperature is subsequently lowered, and the remainder of the monolayer of the metal(s) is deposited before exposing the substrate 62 to oxygen and growing the oxide thereby. Upon formation of the initial monolayer of the film 62, the remaining layers of the film 62, as well as the layers of the films 66 and 68, can be grown in whole layer intervals, without the requirement of an initial deposit (and interruption) of a monolayer of metal atoms over the previously-grown layer. During the process steps involving the build up of layers of the alkaline earth oxide upon the previously-grown layer, metal vapor from the flux sources are released in the appropriate portions so that the resultant build up of oxide layers is provided with the desired lattice parameters.

The aforementioned four monolayers of oxide and the matched lattice parameters providing no more than 2% strain at the interface of the films is advantageous in that lattice strain within the structure 60 is relieved so as to prevent the formation of any catostrophic strains in the structure 60. In other words, the lattice strain (no more than 2%) which would normally be present at a film/film or film/substrate interface is relieved through the four monolayers of oxide (of constant composition). Therefore, before the formation of a subsequent film upon one film, any lattice strain which may have been developed in one film as a result of the lattice mismatch with the substrate or oxide base upon which the one film is grown, disappears by the completion of its fourth monolayer. Therefore, structures can be formed in accordance with the aforementioned process which are substantially defect-free.

Figure 5:
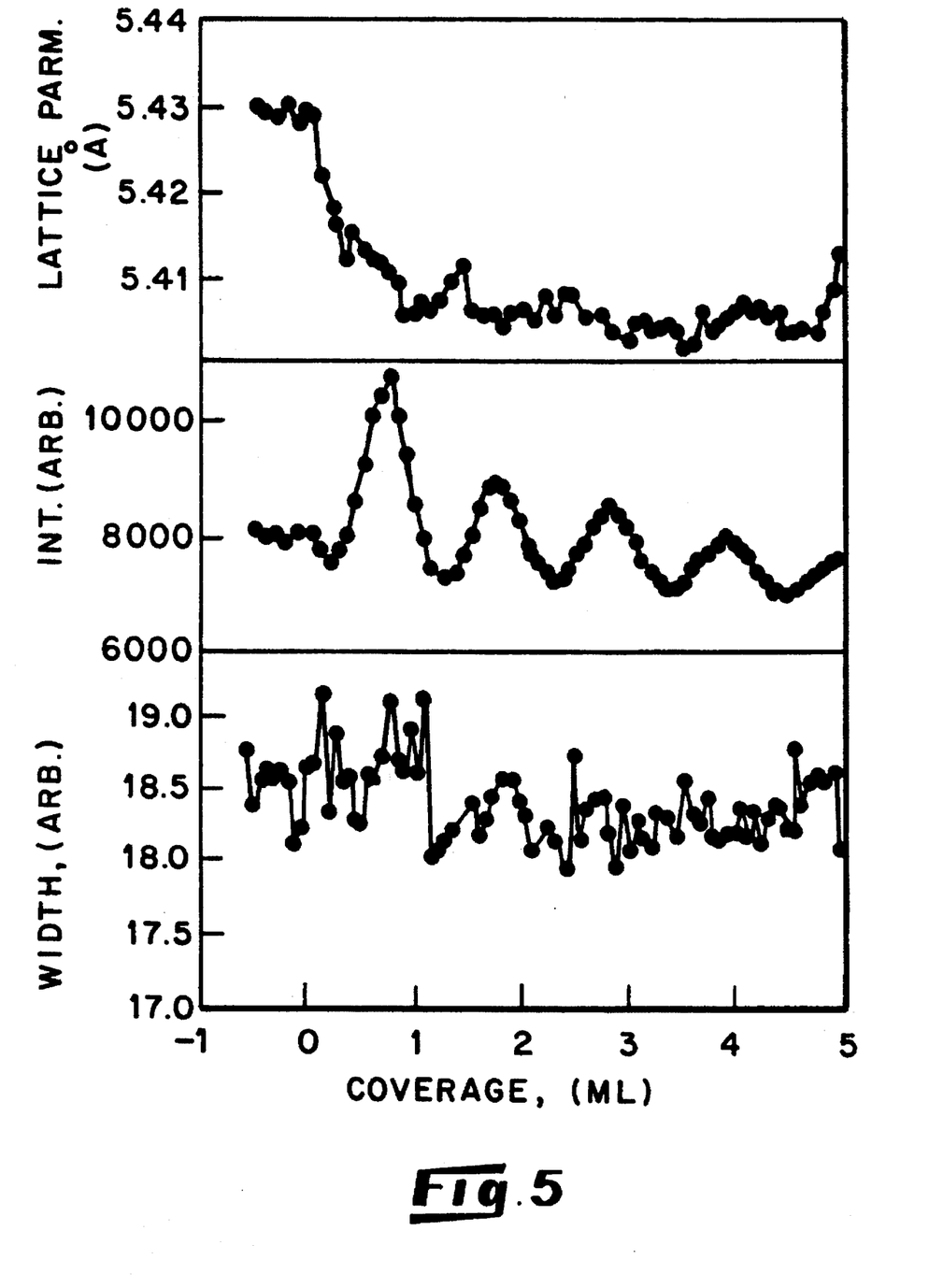
FIGS. 5 and 6 are graphs setting forth obtained experimental data relating to layer-by-layer strain accomodation of $Ba_{0.454}Sr_{0.546}O$ on $Ba_{0.725}Sr_{0.275}O$.
Figure 6:
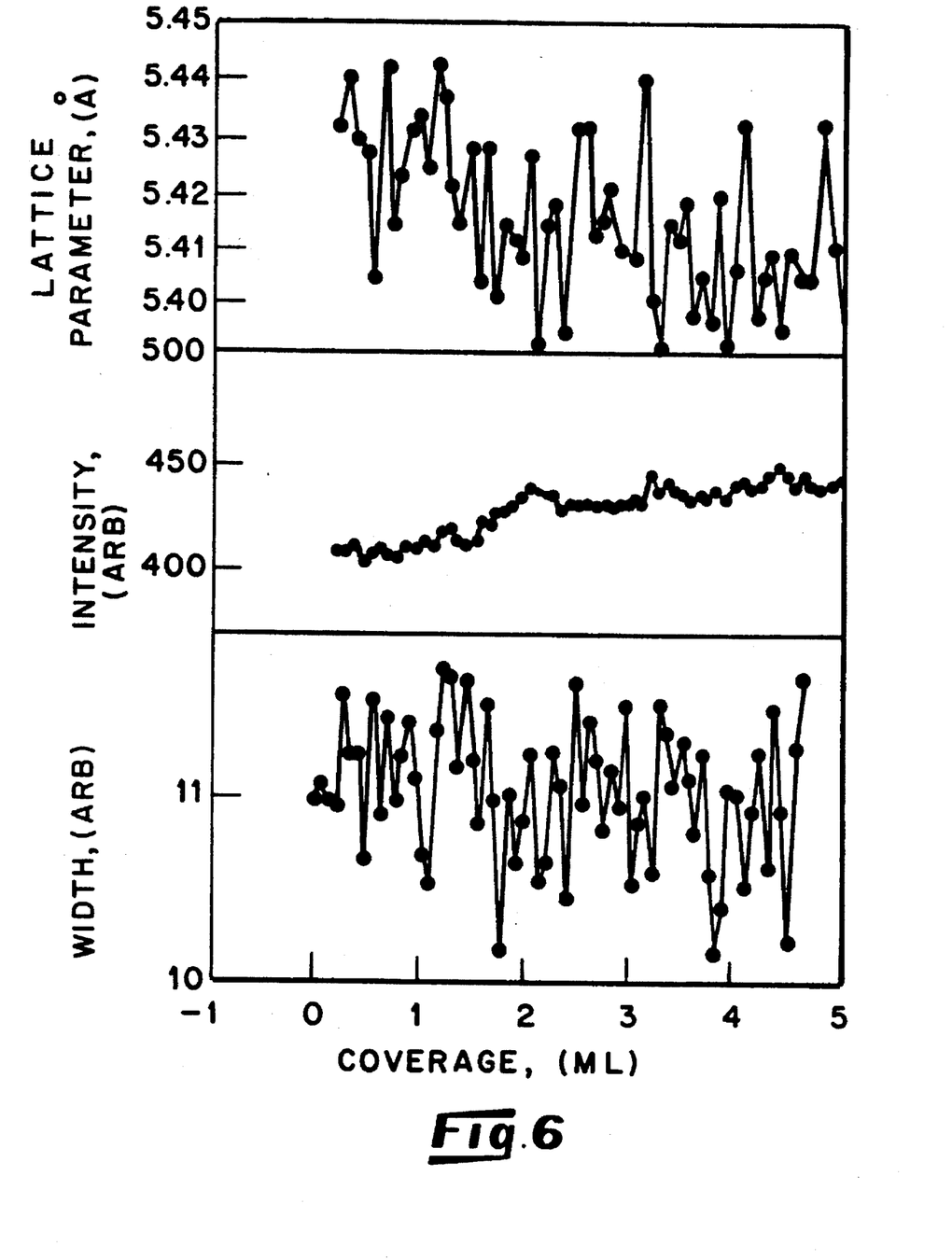

The advantagous, i.e., strain-relieving, qualities of a structure comparable to that of the structure 60 of FIG. 4 have been experimentally confirmed. For example, there is shown in FIGS. 5 and 6 plots of experimental data (gathered from RHEED analysis) relating to the strain accomodation of $Ba_{0.454}Sr_{0.546}O$ on $Ba_{0.725}Sr_{0.275}O$ wherein the lattice parameter of $Ba_{0.454}Sr_{0.546}O$ creates a 2% lattice strain at its interface with the underlying $Ba_{0.725}Sr_{0.275}O$ layer. For comparison purposes, the FIG. 5 data was obtained at a substrate temperature of about 200° C. whereas the FIG. 6 data was obtained at a substrate temperature of about 400° C. The graphs of FIGS. 5 and 6 indicate a decrease in the lattice parameter from 0.543 nm at zero monolayers of coverage to about 0.541 nm at four layers of coverage, and the plots representing the intensity level (a good indication of strain stability) show a stabilization of intensity at about four monolayers of coverage. Moreover, the remaining graphs of FIGS. 5 and 6 show that the width of the mosaic spread of the in-plane crystallites is relatively stable through four monolayers of coverage.

Figure 7:
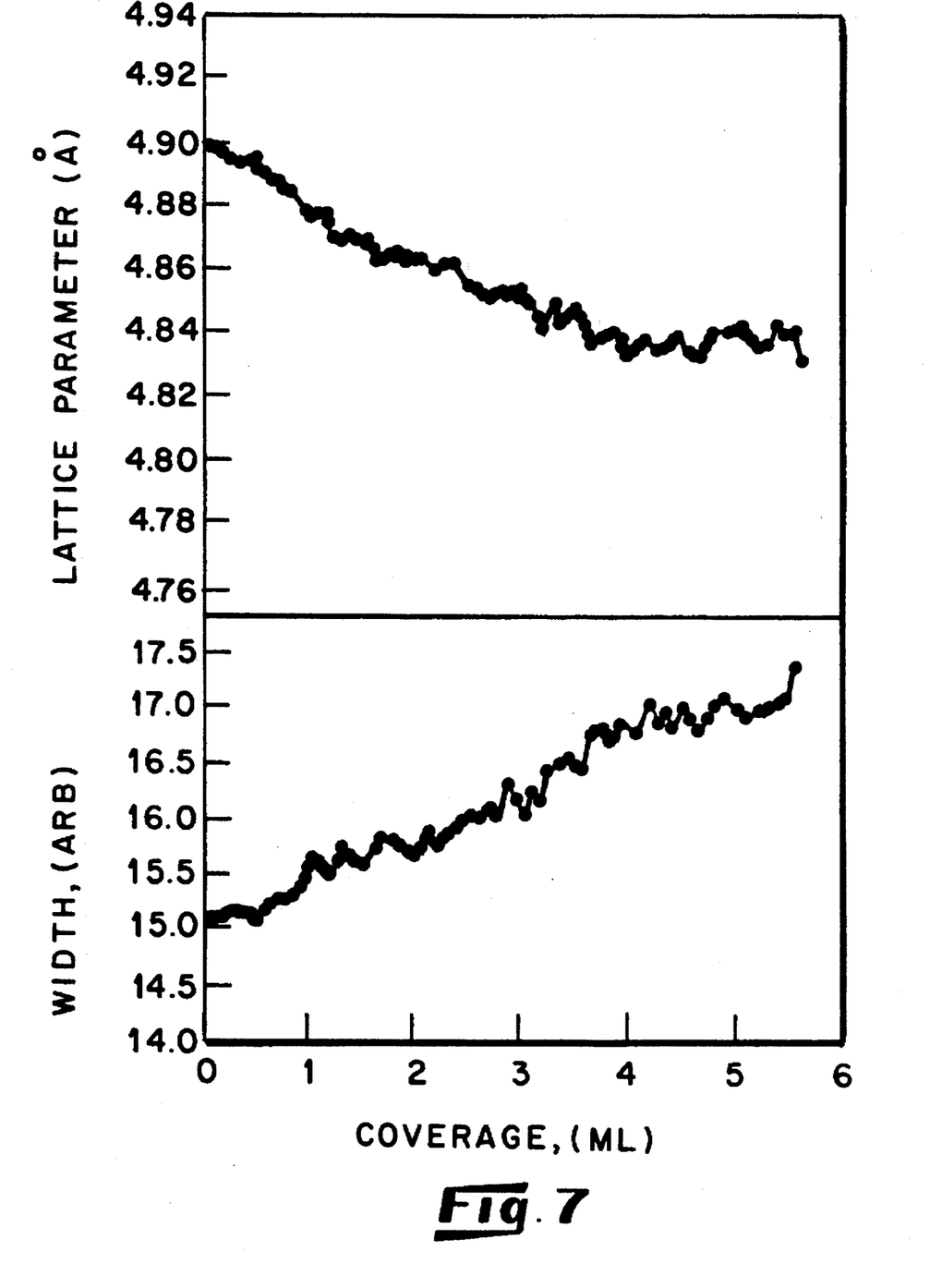
FIG. 7 is a graph which sets forth obtained experimental data relating to layer-by-layer strain accomodation of CaO on $Sr_{0.333}Ca_{0.667}O$.

By way of further example, there is shown in FIG. 7 plots of obtained experimental data relating to the strain accomodation of CaO epitaxially layered upon $Sr_{0.333}Ca_{0.667}O$ wherein the lattice parameter of the CaO creates a 2% lattice strain at the oxide/oxide interface. This data shows a decrease in the lattice parameter of 0.490 nm to 0.484 nm and only a relatively small variation in the measured width of the mosaic spread of the in-plane crystallites through four monolayers of coverage.

Figure 8:
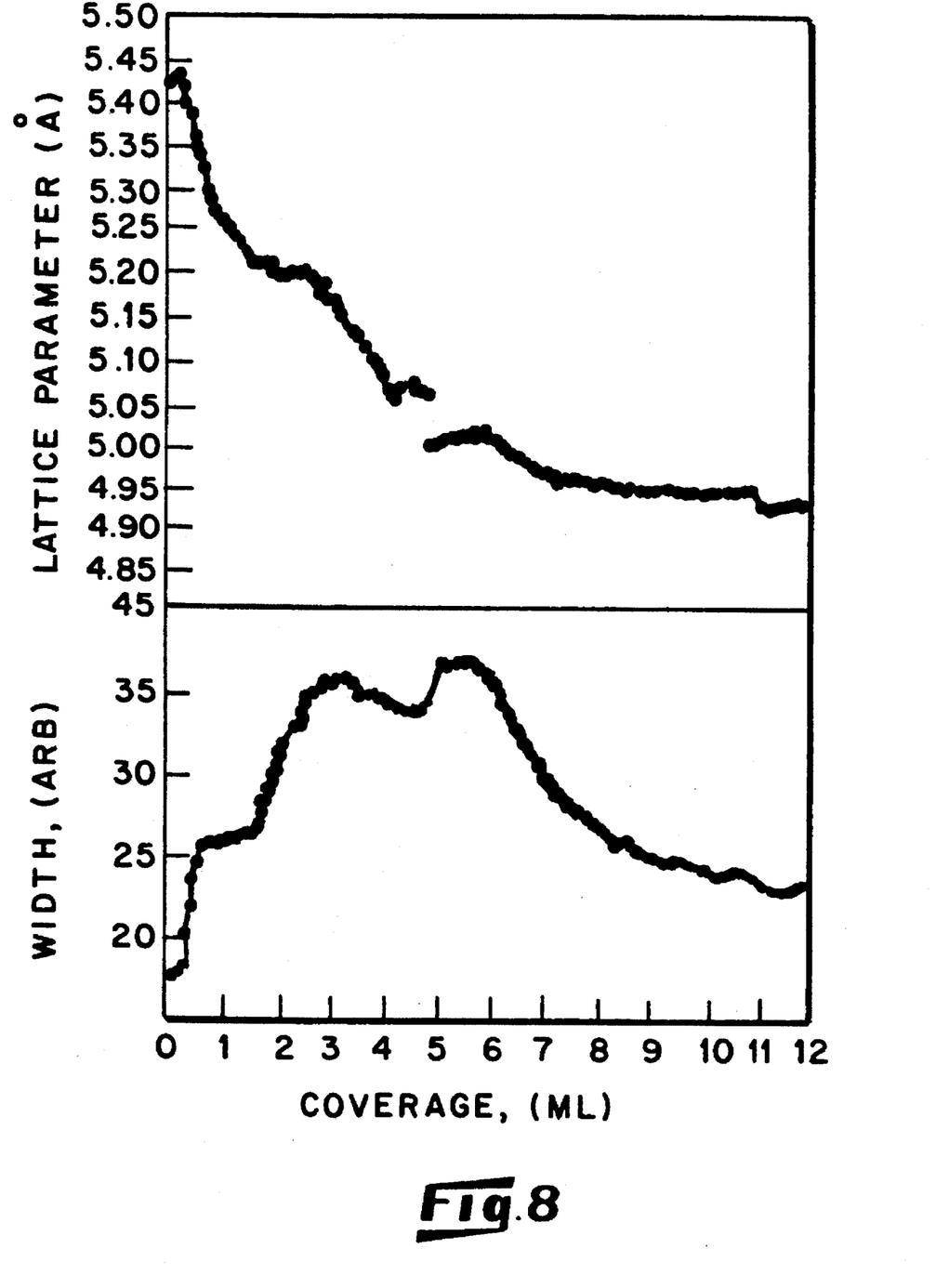
FIG. 8 is a graph which sets forth obtained experimental data relating to layer-by-layer strain accomodation of CaO on $Ba_{0.725}Sr_{0.275}O$.

For purposes of comparison, there is shown in FIG. 8 plots of obtained experimental data relating to the strain accomodation of CaO epitaxially layered upon $Ba_{0.725}Sr_{0.275}O$ wherein the lattice parameter of the CaO creates a 12% lattice strain at the oxide/oxide interface. This data shows a gradual decrease in the lattice parameter of 0.543 nm toward a lattice parameter of 0.490 nm and a recovery of the width of the mosaic spread of the in-plane crystallites as the monolayer coverage of CaO is increased. Although the lattice parameter of the build up of CaO eventually reaches the target parameter of 0.490 nm, more than four monolayers of CaO are required.

It follows from the foregoing that the invention accomplishes its intended objectives. More specifically, a process has been described for growing an epitaxial film of alkaline oxide upon a base layer of silicon or an alkaline earth oxide wherein lattice strain between adjacent layers is reduced or eliminated, and structures have been described which are formed with the process.

It will be understood that numerous modifications and substitutions can be had to the aforementioned embodiments without departing from the spirit of the invention. Accordingly, the aforedescribed embodiments are intended for the purpose of illustration and not as limitation.

We claim:

1. A process for depositing an epitaxial oxide having a sodium chloride-type lattice structure onto a material surface provided by an ordered face-centered-cubic (fcc) lattice structure like that of silicon or an alkaline earth oxide having a sodium chloride-type lattice structure, the process comprising the steps of:

a) providing a base having a surface defined by material which is provided by an ordered fcc lattice structure like that of silicon or an alkaline earth oxide having a sodium chloride-type lattice structure;

b) positioning the base within an ultra-high vacuum facility;

c) selecting at least one metal which, when combined with oxygen to form an alkaline earth oxide, has a lattice parameter which is not identical to but is within about 0.002 nm of that of the lattice structure which provides the material surface; and d) growing with the selected metal and within the facility a film of epitaxial layers of the alkaline earth oxide upon the material surface so that the lattice parameter of the layers of grown oxide is not identical to but is within about 0.002 nm of that of the lattice structure of the material surface to reduce the likelihood of any appreciable lattice strain at the interfaces of the material surface and the epitaxial layers of the alkaline earth oxide built thereon.

2. The process of claim 1 wherein each layer of the alkaline earth oxide is a monolayer of the alkaline earth oxide and step d) is continued until at least four layers of the alkaline earth oxide is grown upon the material surface so that the grown layers of the alkaline earth oxide comprises a first epitaxial oxide film and the growth of the first epitaxial oxide file is followed by a second step of selecting at least one metal which when combined with oxygen to form an alkaline earth oxide, has a lattice parameter which is not identical to but is within about 0.002 nm of that of the lattice structure of the epitaxial oxide grown in the first epitaxial film, and a step of growing a second epitaxial oxide film within the facility and upon the first epitaxial film wherein the second epitaxial film is comprised of layers of an alkaline earth oxide which includes the metal selected during the second selecting step to reduce the likelihood of any appreciable lattice strain at the interfaces of the first epitaxial film and the epitaxial layers of the alkaline earth oxide of the second epitaxial film built thereon.

3. The process as defined in claim 1 wherein the metal selected during the selecting step is selected from a group of metals consisting of Ba, Sr, Ca and Mg and the lattice parameter of the alkaline earth oxide formed with the selected metals creates no more than about a 12% lattice strain when grown epitaxially upon the lattice structure of the material surface.

4. The process as defined in claim 3 wherein the base material surface is provided by silicon and the metals selected during the selecting step are Ba and Sr.

5. The process as defined in claim 4 wherein the ratio of Ba to Sr utilized in the steps involving the depositing of the metals onto the material surface is about 0.725 to 0.275.

6. The process as defined in claim 3 wherein the base material surface is provided by $Ba_xSr_{1-x}O$ and the metal selected during the selecting step is Sr.

7. The process as defined in claim 3 wherein the base material surface is provided by SrO and the metals selected during the selecting step are Sr and Ca.

8. The process as defined in claim 7 wherein the ratio of Sr to Ca utilized in the steps involving the depositing of the metals onto the material surface is about 0.333 to 0.667.

9. The process as defined in claim 3 wherein the base material surface is provided by $Sr_yCa_{1-y}O$ and the metal selected in the selecting step is Ca.

10. The process as defined in claim 3 wherein the base material surface is provided by CaO and the metal selected in the selecting step is MgO.

11. The process as defined in claim 1 for use when growing an epitaxial oxide layer having a sodium chloride-type lattice structure having a first lattice parameter onto a material surface provided by an ordered fcc lattice structure like that of silicon or an alkaline earth oxide having a sodium chloride-type lattice structure having a second lattice parameter wherein the step of selecting effects the selection of a pair of metals from a group of metals including ba, Sr, Ca and Mg which when mixed and combined with oxygen, form an alkaline earth oxide having a lattice parameter which is intermediate the first and second lattice parameters; and the step of growing includes the exposure of the material surface to the selected pair of metals so that the layers of the alkaline earth oxide which form during step d) are the layers of the alkaline earth oxide having the lattice parameter which is intermediate the first and second lattice parameters.

12. The process as defined in claim 1 wherein the base material surface is provided by silicon and the step of growing includes the steps of heating the silicon material to a high temperature and developing an ultra high vacuum, oxygen-free environment about the surface of the material;

depositing an amount of the selected metal from a flux source onto the material surface until a fraction of a monolayer of the selected metal covers the material surface while maintaining the environment of the material surface oxygen-free and at a relatively high temperature so that the selected metal and the material of the material surface react to form a submonolayer of a compound which is epitaxially matched to that of the surface material at the metal/silicon interface;

lowering the temperature of the silicon material to between 200° and 300° C.;

depositing an additional amount of the selected metal from the flux source upon the material surface until the material surface is covered by about one monolayer of the selected metal;

without exposing the metal-covered surface, raising the pressure of the high vacuum environment to a target pressure of between about $1 \times 10^{-6}$ torr and $5 \times 10^{-6}$ torr with the introduction of oxygen and introducing an additional amount of the selected metal from the flux source into the high vacuum environment necessary to deposit the selected metal upon the substrate surface at a relatively slow rate; and upon reaching the target pressure, exposing the metal-covered surface to the oxygen and metal within the high vacuum environment so that epitaxial oxide having a lattice parameter which closely approximates that of the lattice structure of silicon begins to grow upon the silicon material surface.

13. The process as defined in claim 1 wherein the step of growing is effected within the ultra-high vacuum facility by either molecular beam epitaxy or electron beam evaporation techniques.

14. A structure formed by the process of claim 1.

15. A process for growing an epitaxial alkaline earth oxide film having a sodium chloride-type lattice structure onto a material surface provided by an ordered face-centered-cubic (fcc) lattice structure like that of silicon or an alkaline earth oxide having a sodium chloride-type lattice structure, the process comprising the steps of:

a) providing a base having a surface defined by material which is provided by an ordered fcc lattice structure like that of silicon or an alkaline earth oxide having a sodium chloride-type lattice structure;

b) positioning the base within an ultra-high vacuum facility;

c) selecting at least one metal which, when combined with oxygen to form an alkaline earth oxide, has a lattice parameter which creates no more than about a 2% lattice strain when grown epitaxially upon the lattice structure of the material surface; and d) growing with the selected metal and within the facility a film comprised of at least four epitaxial monolayers of the alkaline earth oxide upon the material surface so that the grown oxide has a lattice parameter which creates no more than about a 2% lattice strain at the oxide/material surface interface.

16. The process as defined in claim 15 wherein the four monolayers of the epitaxial oxide grown upon the material surface is a first alkaline earth oxide film and step d) is followed by a second step of selecting at least one metal which when combined with oxygen to form an alkaline earth oxide, has a lattice parameter which provides no more than about a 2% lattice strain with the lattice of the first oxide film, and repeating step d) wherein the surface of the first oxide film provides the surface of the material of the base and the metal selected during the second selecting step is utilized during the repeated step d) so that upon completion of the repeated step d), a second epitaxial alkaline earth oxide film is grown upon the first alkaline earth oxide film.

17. The process as defined in claim 15 wherein the base material surface is provided by silicon and the step of growing includes the steps of heating the silicon material to a high temperature and developing an ultra high vacuum, oxygen-free environment about the surface of the material;

depositing an amount of the selected metal from a flux source onto the material surface until a fraction of a monolayer of the selected metal covers the material surface while maintaining the environment of the material surface oxygen-free and at a relatively high temperature so that the selected metal and the material of the material surface react to form a submonolayer of a compound which is epitaxially matched to that of the surface material at the metal/silicon interface;

lowering the temperature of the silicon material to between 200° and 300° C.;

depositing an additional amount of the selected metal from the flux source upon the material surface until the material surface is covered by about one monolayer of the selected metal;

without exposing the metal-covered surface, raising the pressure of the high vacuum environment to a target pressure of between about $1 \times 10^{-6}$ torr and $5 \times 10^{-6}$ torr with the introduction of oxygen and introducing an additional amount of the selected metal from the flux source into the high vacuum environment necessary to deposit the selected metal upon the substrate surface at a relatively slow rate; and upon reaching the target pressure, exposing the metal-covered surface to the oxygen and metal within the high vacuum environment so that epitaxial oxide having a lattice parameter which creates no more than about 2% lattice strain at the oxide/silicon interface grows upon the silicon material surface.

18. A structure formed by the process of claim 15.

19. A structure including a material surface provided by an ordered face-centered-cubic lattice structure like that of silicon or an alkaline earth oxide having a sodium chloride-type lattice structure and a layup of at least two epitaxial alkaline earth oxide film layers overlying the material surface, the improvement characterized in that the lattice structure of each of the alkaline earth oxide film layers closely approximates that of the structure of the material over which the oxide film layer is directly superposed.

20. The improvement of claim 19 wherein the lattice parameter of each of the alkaline earth oxide film layers is within about 0.002 nm of that of the structure of the material over which the oxide film layer is directly superimposed.

21. The improvement of claim 19 wherein one of the epitaxial oxide film layers is directly superposed over the material surface, the lattice parameter of the one oxide film provides no more than about a 2% lattice strain at the oxide/structure interface, and the one oxide film includes at least four monolayers of the one oxide.

* * * * *